(12) United States Patent
Akiyama et al.

(10) Patent No.: US 6,255,858 B1
(45) Date of Patent: Jul. 3, 2001

(54) PHASE-FREQUENCY DETECTOR AND PHASE-LOCKED LOOP CIRCUIT INCORPORATING THE SAME

(75) Inventors: Chiyoshi Akiyama; Toshio Kawasaki, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/383,574

(22) Filed: Aug. 25, 1999

(30) Foreign Application Priority Data

Sep. 21, 1998 (JP) .................................... 10-266765

(51) Int. Cl.[7] ................................. H03D 3/00; H03L 7/06
(52) U.S. Cl. .................................... 327/12; 327/3; 327/47; 327/156; 327/147
(58) Field of Search ............................ 327/2, 3, 12, 39, 327/40, 41, 47, 48, 156, 147, 362

(56) References Cited

U.S. PATENT DOCUMENTS 5,079,512 * 1/1992 Muto ..................................... 329/304

* cited by examiner

*Primary Examiner*—Dinh T. Le
(74) *Attorney, Agent, or Firm*—Helfgott & Karas, P.C.

(57) ABSTRACT

By applying a modification considering a frequency difference to a phase error signal, phase lock is established in a short period of time even when there is a frequency difference. A jump detector detects a discontinuous jump of the phase error signal which occurs when there is a frequency difference, and a state transition is caused in a state storage device in accordance with the resulting detection signal. A holding device corrects the phase error signal in accordance with the state stored in the state storage device and outputs the thus corrected phase error signal as a frequency-phase error signal.

12 Claims, 11 Drawing Sheets

PHASE-FREQUENCY DETECTOR AND PHASE-LOCKED LOOP CIRCUIT INCORPORATING THE SAME

BACKGROUND OF THE INVENTION

1. Field of the Invention

The present invention relates to a phase-frequency detector which detects a frequency error between two signals from a temporal change in a phase error signal representing the phase difference between the two signals corrects the phase error signal, and outputs the corrected phase error signal, and a phase-locked loop circuit incorporating the phase-frequency detector.

2. Description of the Related Art

A phase-locked loop (PLL) circuit is used to recover a carrier from an intermediate frequency (IF) signal. In this case a baseband signal consisting of an I-phase signal and a Q-phase signal is generated by multiplying the input IF signal by two recovered quadrature carriers. These component signals are converted by A/D converters into digital signals and the values of the I-phase and Q-phase signals are fed as addresses to a ROM where the value of $\tan^{-1}(Q/I)$ is stored, to generate the phase error signal related to the phase difference between the input signal and the recovered carrier. The frequency of the recovered carrier is controlled by the phase error signal thus generated and whose high-frequency component has been removed by a low-pass filter.

The phase error signal generated as described above varies periodically within the range of ±180° because of the periodicity of the function $\tan^{-1}$. Accordingly, if the frequency of the input signal is far from that of the recovered carrier there arises the problem that synchronization cannot be established or the time required to establish synchronization becomes extremely long.

SUMMARY OF THE INVENTION

It is accordingly, an object of the present invention to provide a phase-frequency detector for generating a frequency-phase error signal taking account of the frequency difference as well as the phase difference between two signals, and a phase-locked loop circuit incorporating the phase-frequency detector and capable of establishing synchronization in a short period of time even when the two signals are far from each other in frequency.

According to the present invention there is provided a phase-frequency detector comprising: a frequency error detector which detects and outputs a frequency error between two signals based on a change in a phase error signal representing a phase error between the two signals; and a signal corrector which corrects the phase error signal based on the output of the frequency error detector, and outputs the corrected phase error signal as a frequency-phase error signal.

According to the present invention there is also provided a phase-locked loop circuit comprising: a phase comparator which compares the phase of an input signal with the phase of a signal output from an oscillator, and outputs a phase error signal representing a phase error between the two signals; a phase-frequency detector including a frequency error detector which detects and outputs a frequency error between the two signals, based on a change in the phase error signal, and a signal corrector which corrects the phase error signal based on the output of the frequency error detector, and outputs the corrected phase error signal as a frequency-phase error signal; a low-pass filter which passes therethrough only a low-frequency component contained in the frequency-phase error signal; and the oscillator which outputs a signal of a frequency corresponding to the output of the low-pass filter.

DESCRIPTION OF THE PREFERRED EMBODIMENTS

Figure 1:
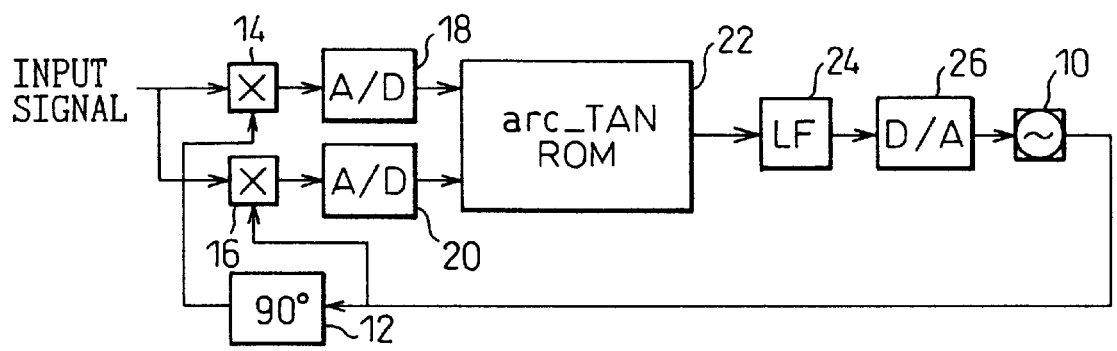
FIG. 1 is a block diagram showing a prior art PLL circuit.

FIG. 1 shows the configuration of a prior art PLL circuit which causes the recovered carrier to synchronize with an input signal. In FIG. 1, two carriers in phase quadrature to each other are generated by a 90° phase shifter 12 from the output of a voltage-controlled oscillator 10, and supplied to multipliers 14 and 16 where the input signal is multiplied by the carriers to generate an I-phase signal and a Q-phase signal, respectively. These signals are converted by A/D converters 18 and 20 into digital signals which are supplied as addresses to a ROM 22. The ROM 22 outputs a phase error $\tan^{-1}$ (Q/I) which is passed through a low-pass filter 24 and a D/A converter 26 and supplied as a frequency control signal to the voltage-controlled oscillator 10.

Figure 2:
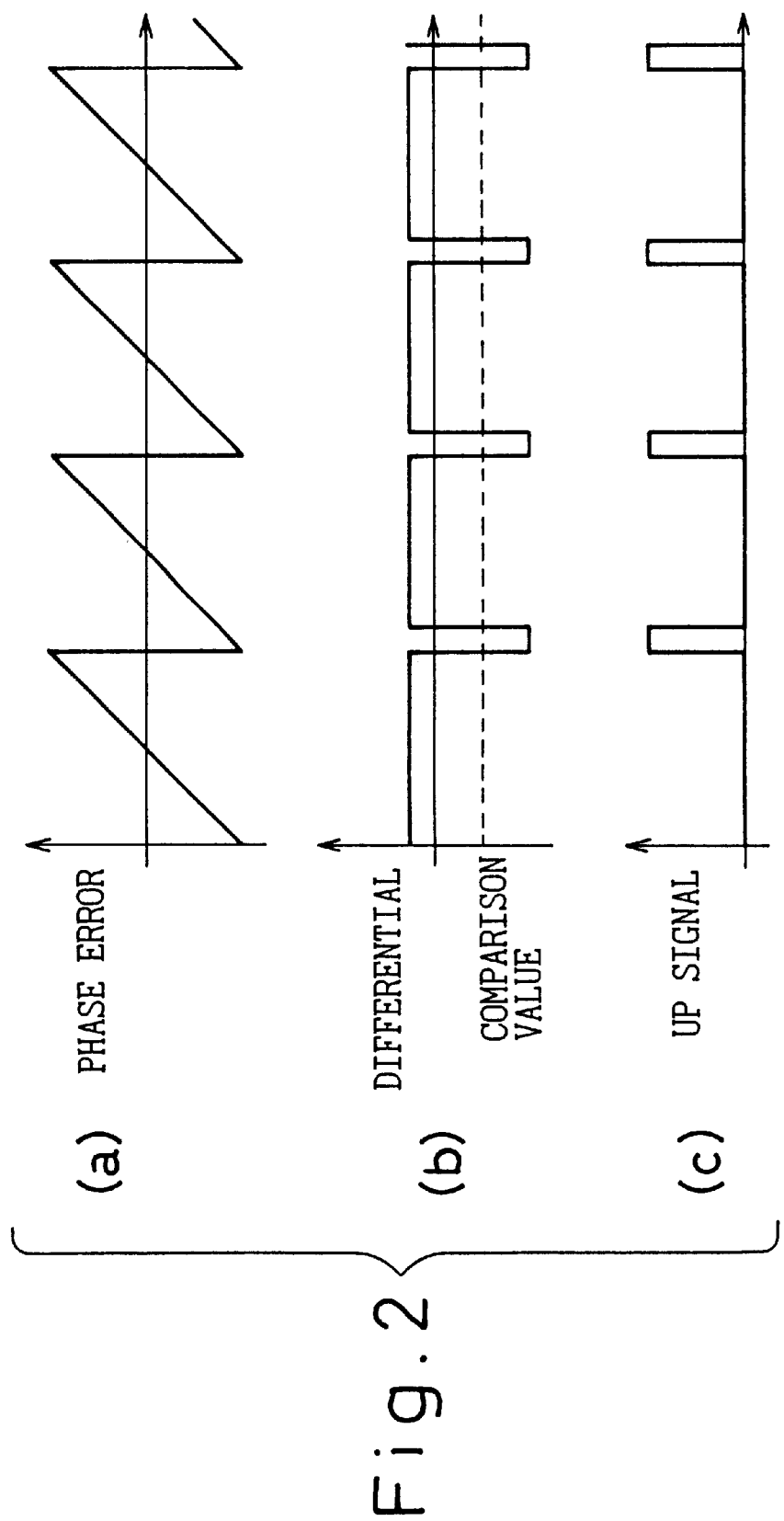
FIG. 2 is a waveform diagram illustrating a phase error signal, the differential thereof, and an UP signal when two signals are far from each other in frequency.
Figure 3:
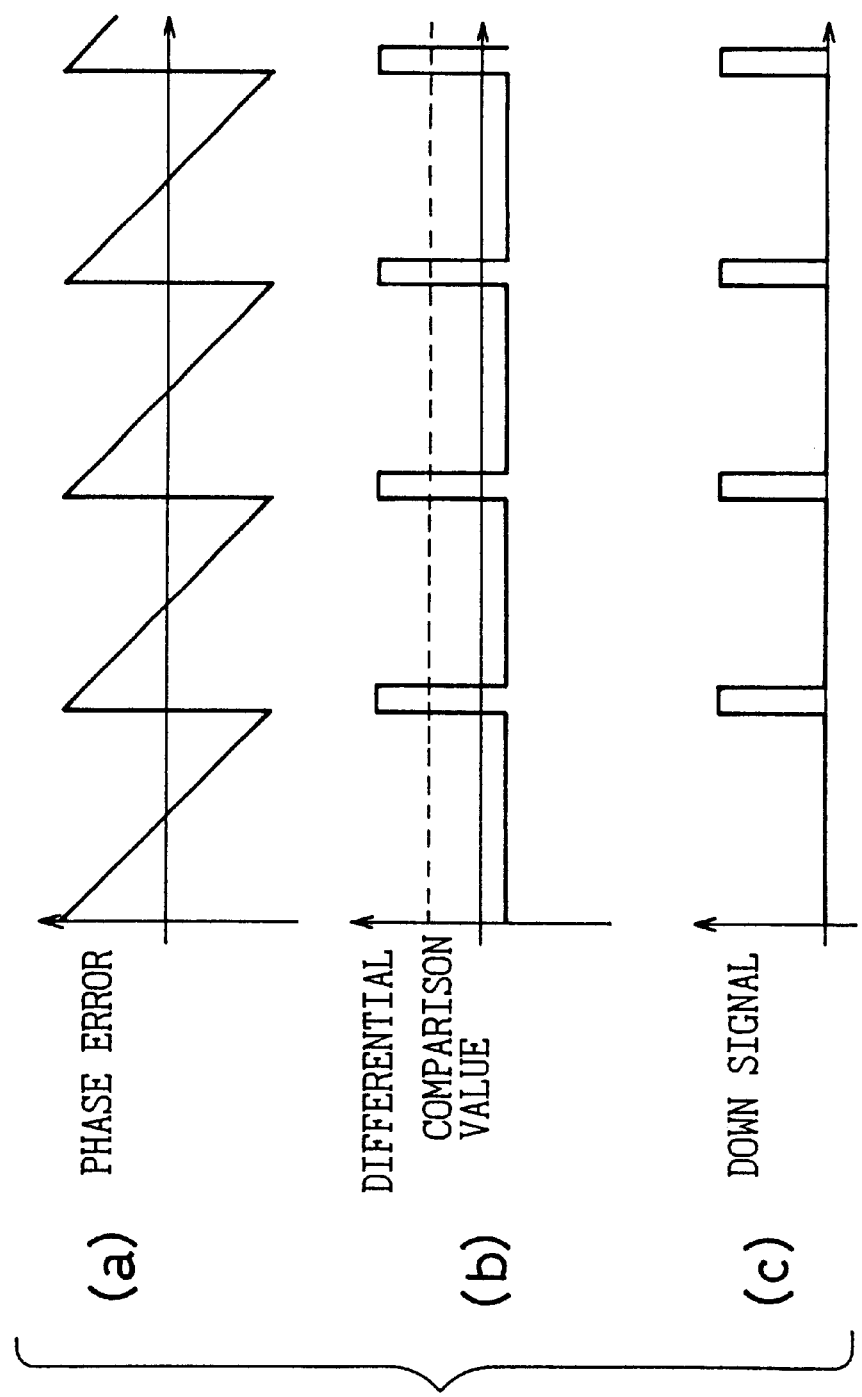
FIG. 3 is a waveform diagram illustrating a phase error signal, the differential thereof, and a DOWN signal when the state of the frequency difference is opposite to that in FIG. 2.

Part (a) of FIG. 2 shows the change of the phase error signal when the frequency of the voltage-controlled oscillator 10 is far from the frequency of the input signal. As can be seen from FIG. 2(a), when there is a constant frequency difference between them the phase error increases with time at a constant speed until it reaches a maximum value (+180°), upon which it jumps discontinuously to a minimum value (−180°). If the state of the frequency difference is opposite to that in FIG. 2(a), the phase error signal decreases at a constant speed until it reaches the minimum value (−180°), upon which it jumps discontinuously to the maximum value (+180°), as shown in part (a) of FIG. 3.

In the present invention, a signal for determining the state of the frequency difference between the two signals is generated by detecting the direction of this phase jump. More specifically, in the case of FIG. 2(a), the differential of the phase error signal i.e., the amount of change of the phase error signal from its previous value, is as shown in part (b) of FIG. 2. By comparing the resulting value with a negative comparison value (for example, −90°), the phase jump in the negative direction is detected and an UP signal such as shown in FIG. 2(c) is generated. Likewise, by comparing the differential with a positive comparison value (for example, +90°), as shown in FIG. 3(b), the phase jump in the positive direction is detected and a DOWN signal such as shown in FIG. 3(c) is generated.

Figure 4:
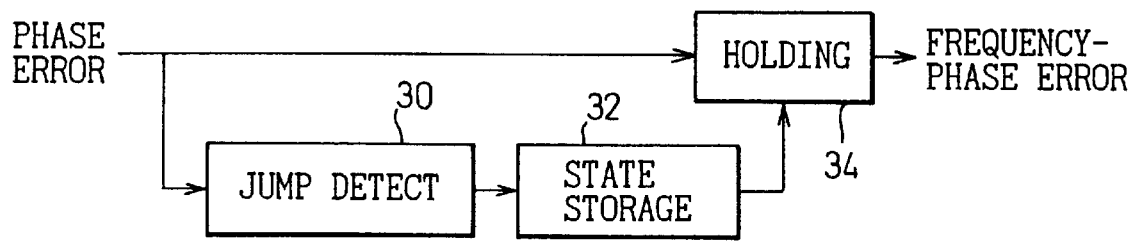
FIG. 4 is a block diagram showing the configuration of a phase-frequency detector according to one embodiment of the present invention.

FIG. 4 shows the configuration of a phase-frequency detector according to one embodiment of the present invention. A jump detector 30 outputs an UP signal or a DOWN signal by detecting a phase jump in the phase error signal fed from the phase comparator (comprising, for example, the multipliers 14, 16 and ROM 22 shown in FIG. 1) in the manner described above. A state storage device 32 stores a state corresponding to the state of the frequency difference between the two signals, and causes the state to make a transition according to the UP and DOWN signals. The combination of the jump detector 30 and the state storage device 32 thus act as a frequency error detector. A holding device 34 holds or passes therethrough the phase error signal, depending on the state corresponding to the state of the frequency difference.

Figure 5:
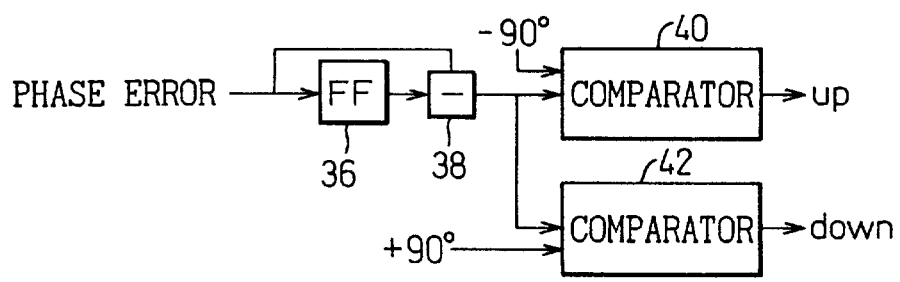
FIG. 5 is a circuit diagram showing the detailed configuration of a jump detector 30.

FIG. 5 shows the configuration of the jump detector 30. A flip-flop 36 holds the phase error signal in synchronism with a clock (not shown). A subtractor 38 subtracts the previous value held by the flip-flop 36 from the current value of the phase error signal, and generates the differential, i.e., the difference from the previous value. The combination of the flip-flop 36 and the subtractor 38 thus act as a differentiator. A comparator 40 compares the output of the subtractor 38 with a negative comparison value for example, −90° and, if the former is lower than the latter, outputs an UP signal such as shown in FIG. 2(c). A comparator 42 compares the output of the subtractor 38 with a positive comparison value, for example, +90° and, if the former is higher than the latter outputs a DOWN signal such as shown in FIG. 3(c).

Figure 6:
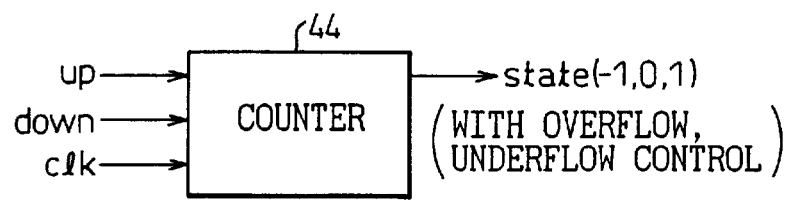
FIG. 6 is a circuit diagram showing the detailed configuration of a state storage device 32.
Figure 8:
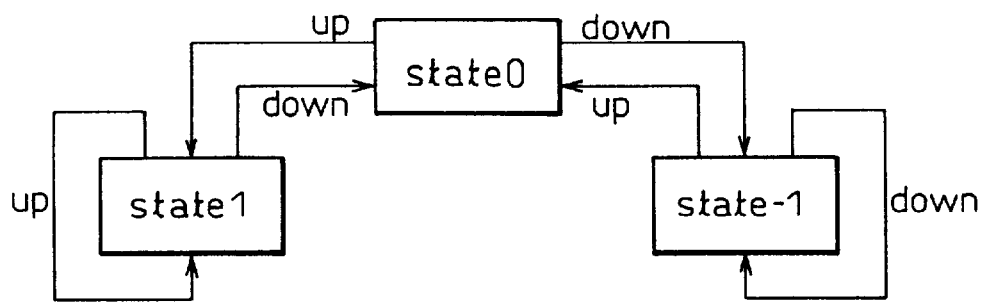
FIG. 8 is a state transition diagram for the state storage device 32.

The state storage device 32 in FIG. 4 is implemented using, for example an up-down counter 44 with overflow and underflow control, as shown in FIG. 6. FIG. 8 shows the state transition diagram for the up-down counter 44. In FIG. 8, "state 1" indicates the state in which the frequency of one signal is higher than that of the other signal, and "state −1" the opposite state, while "state 0" indicates the state in which the frequencies of the two signals are substantially identical. When the DOWN signal is input in "state 1", a transition is made to "state 0", and when the DOWN signal is again input, a transition is made to "state −1"; if the DOWN signal is again input in this state, the state remains at "state −1". When the UP signal is input in "state −1", a transition is made to "state 0", and when the UP signal is again input, a transition is made to "state 1"; if the UP signal is again input in this state the state remains at "state 1". The output of the state storage device 32 being "state 1", "state 0" or "state −1", thus corresponds to the difference in frequency or frequency error between the two signals.

Figure 7:
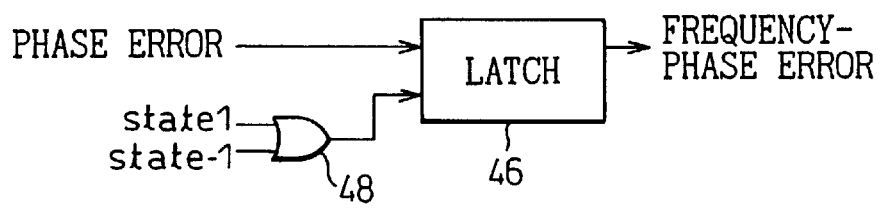
FIG. 7 is a circuit diagram showing the detailed configuration of a holding device 34.
Figure 9:
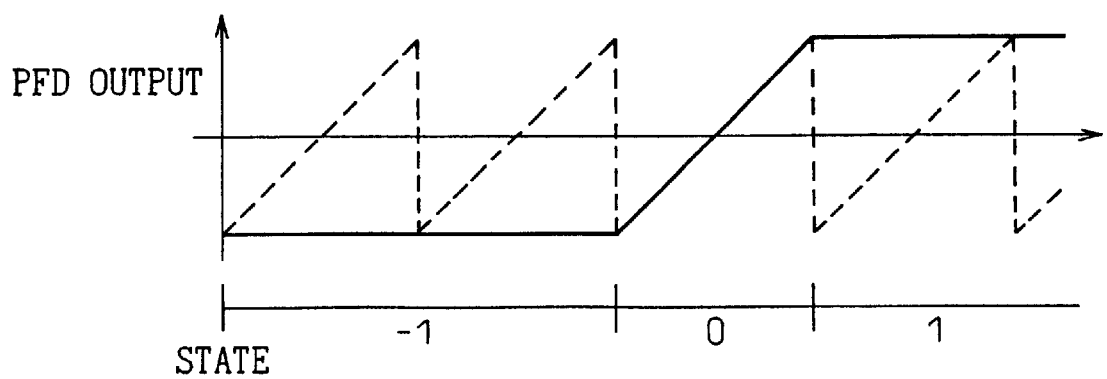
FIG. 9 is a graph showing a frequency-phase error signal in the circuit of FIG. 4.

FIG. 7 shows an example of the detailed configuration of the holding device 34 in FIG. 4. The output of an OR circuit 48 changes from "false" to "true" when the state changes from "state 0" to "state 1" or from "state 0" to "state −1". A latch 46 latches the phase error signal at this moment and outputs it as a frequency-phase error signal. As long as the state remains at "state 0", the phase error signal is passed through and output as the frequency-phase error signal. As a result, the frequency-phase error signal varies as shown by the solid line in FIG. 9. As can be seen from FIG. 9, in "state 0" where the frequencies of the two signals are substantially identical, the frequency-phase error signal varies linearly according to the phase difference between the two signals, while in "state 1" or "state −1", the error signal is held at a constant value. Accordingly, when this error signal is used for the frequency control of a PLL circuit, synchronization can be established in a short period of time even when the two signals are far from each other in frequency. The holding device 34, thus acts as a signal corrector.

Figure 10:
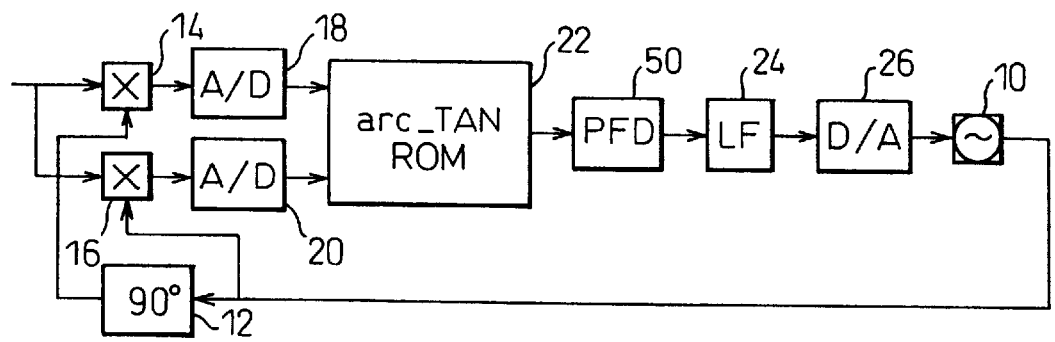
FIG. 10 is a block diagram showing one example of a PLL circuit incorporating the phase-frequency detector of the present invention.

FIG. 10 shows an example in which the phase-frequency detector of the present invention is incorporated in a PLL circuit used for carrier recovery. The difference from FIG. 1 is the inclusion of the phase-frequency detector 50 of the present invention which is inserted between the ROM 22 and the low-pass filter 24. As described above, the phase-frequency detector 50 detects the frequency difference based on the phase error signal output from the ROM 22, corrects the phase error signal according to the detected frequency difference, and outputs the thus corrected phase error signal as the frequency-phase error signal. With this configuration, synchronization can be established in a short period of time even when a frequency difference exists between the input signal and the output of the oscillator 10.

Figure 11:
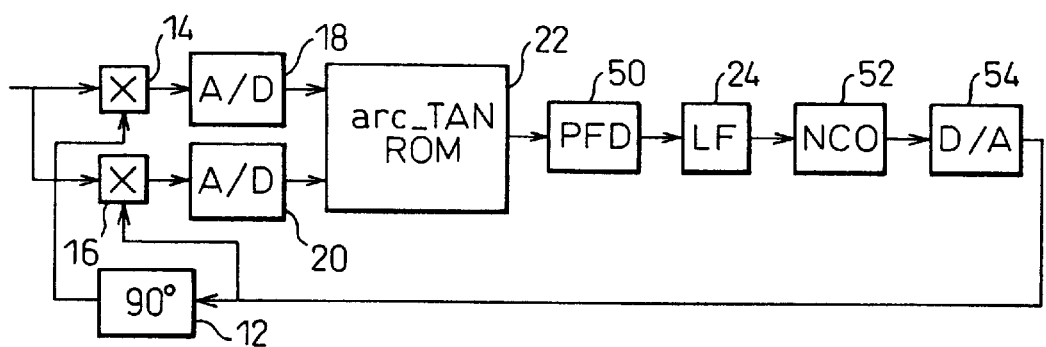
FIG. 11 is a block diagram showing another example of the PLL circuit incorporating the phase-frequency detector of the present invention.

FIG. 11 shows another example of the PLL circuit. In FIG. 11, the D/A converter 26 and voltage-controlled oscillator 10 in FIG. 10 are replaced by a numerically controlled oscillator 52 and a D/A converter 54.

Figure 12:
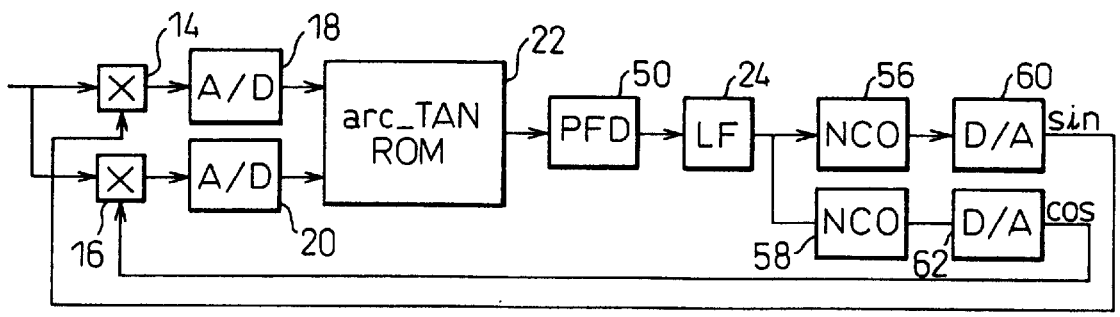
FIG. 12 is a block diagram showing still another example of the PLL circuit incorporating the phase-frequency detector of the present invention.

FIG. 12 shows still another example of the PLL circuit. In FIG. 12, instead of using the 90° phase shifter in FIG. 11, two numerically controlled oscillators 56 and 58 are used to generate two digital signals in phase quadrature, and these signals are converted by two D/A converters 60 and 62 into analog signals which are applied to the respective multipliers 14 and 16.

Figure 13:
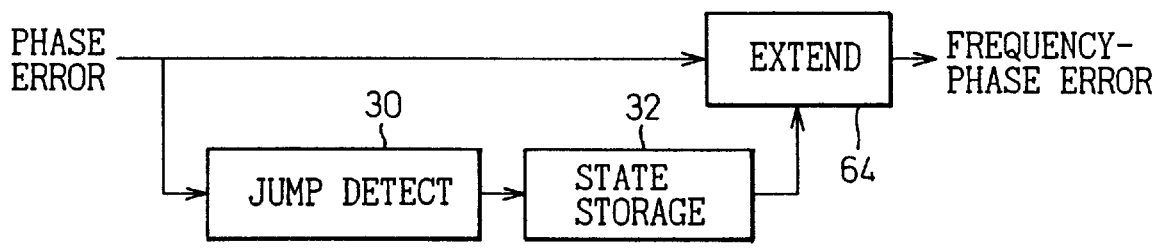
FIG. 13 is a block diagram showing another example of the phase-frequency detector of the present invention.

FIG. 13 shows another example of the phase-frequency detector of the present invention. In the phase-frequency detector in FIG. 13, the holding device 34 in FIG. 4 is replaced by an extender 64.

Figure 14:
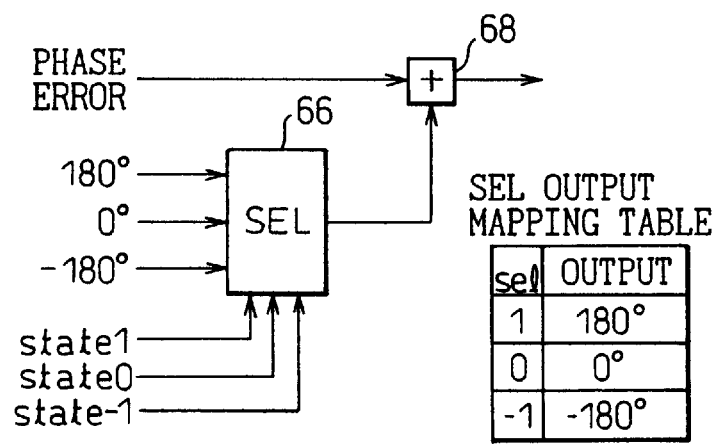
FIG. 14 is a circuit diagram showing the detailed configuration of an extender 64.
Figure 15:
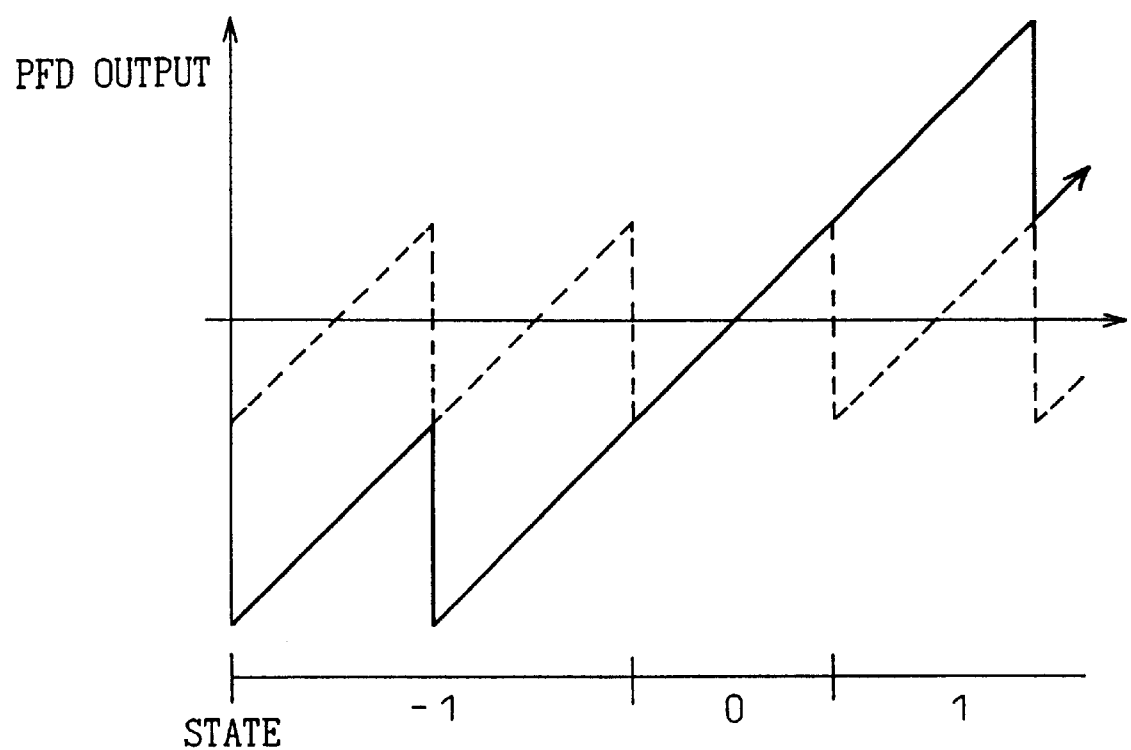
FIG. 15 is a graph showing a frequency-phase error signal in the circuit of FIG. 13.

FIG. 14 shows the detailed configuration of the extender 64. A selector 66 selects and outputs 180°, 0°, and −180° for state 1, state 0, and state −1, respectively. An adder 68 adds the value selected by the selector 66 to the phase error signal and outputs the result as the frequency-phase error detection signal. The solid line in FIG. 15 shows this frequency-phase error signal. Since the error signal is extended in state 1 and state −1 according to the state of the frequency difference between the two signals, synchronization can be established in a short period of time even when there is a frequency difference between them.

Figure 16:
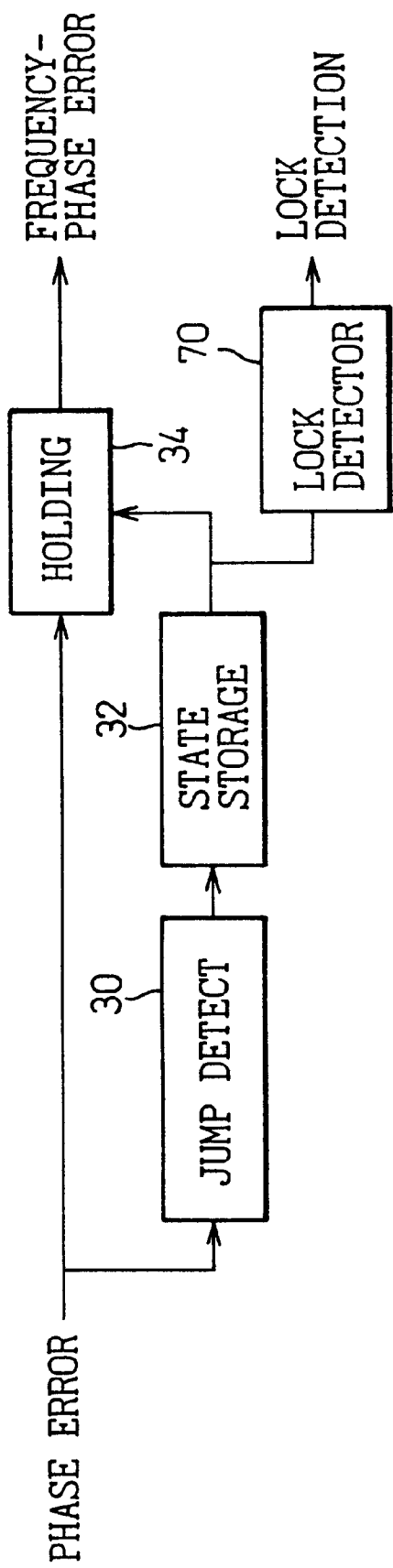
FIG. 16 is a block diagram of a phase-frequency detector in which a lock detector 70 is added.
Figure 17:
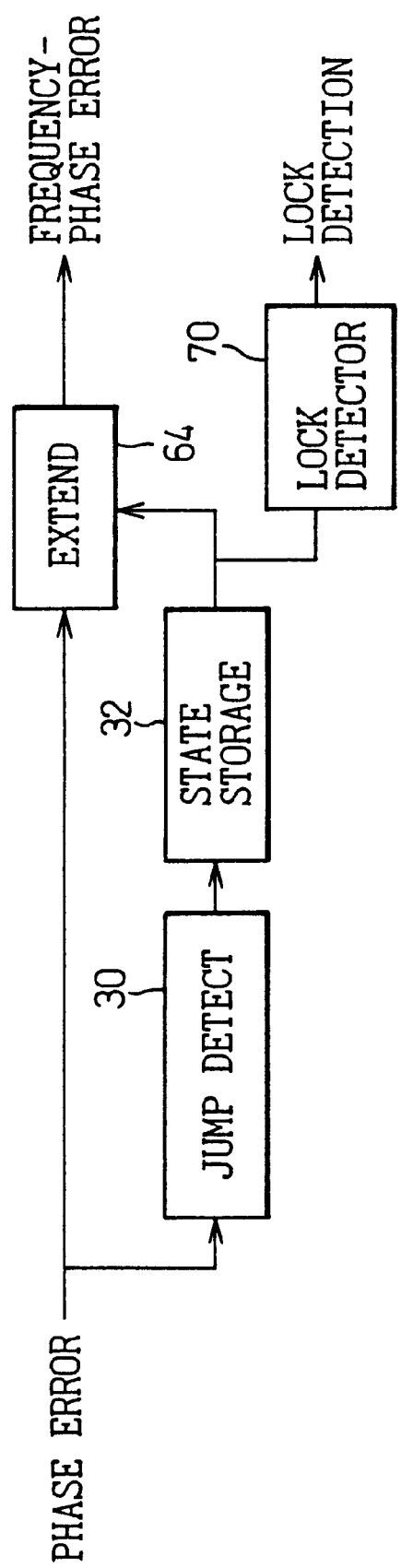
FIG. 17 is a block diagram showing another example of the phase-frequency detector in which the lock detector 70 is added.
Figure 18:
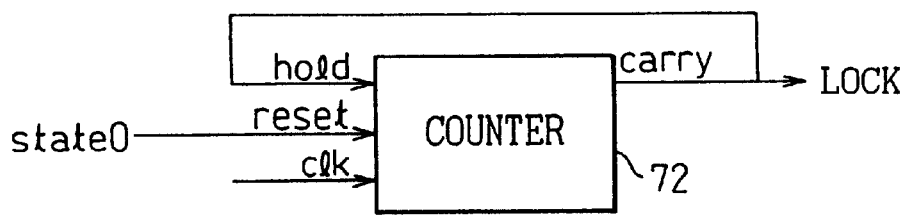
FIG. 18 is a circuit diagram showing the detailed configuration of the lock detector 70.
Figure 19:
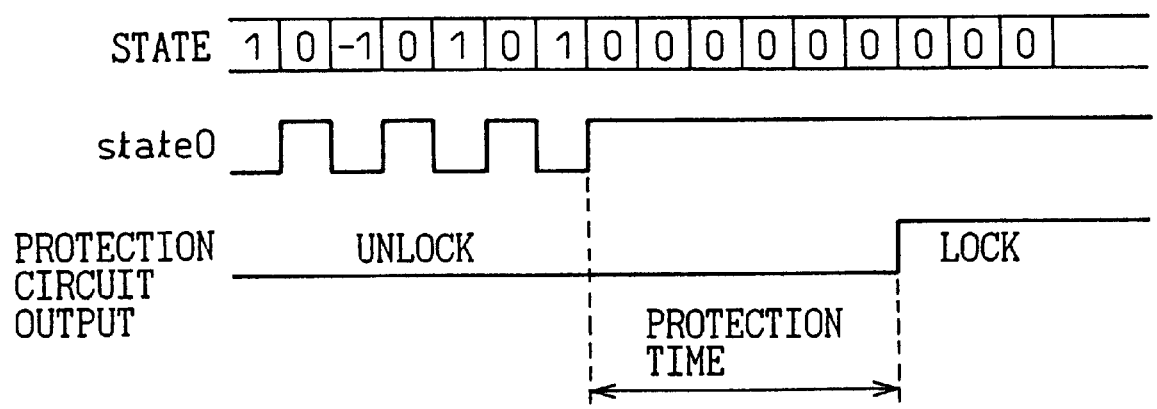
FIG. 19 is a waveform diagram illustrating the operation of the lock detector.

FIG. 16 and 17 show examples in which a lock detector 70 which outputs a lock detection signal to indicate that the PLL is locked with the frequencies of the two signals coinciding with each other, is added in the phase-frequency detectors shown in FIGS. 4 and 13, respectively. The lock detector 70 is implemented using, for example, a counter 72 as shown in FIG. 18. Signal "state 0" is connected to the reset input of the counter 72, and the lock signal is taken from the carry output of the counter 72. The carry output is connected to the hold input of the counter 72. As shown in FIG. 19, the counter 72 counts up when the state is state 0, and is reset in other states that is state 1 or state −1. When state 0 occurs a predetermined number of times in succession, the counter 72 outputs a carry and is held at that value. That is when state 0 continues for a predetermined protection time, the lock signal is output by determining that phase lock has been established. The length of the protection time is determined by considering the response time and other parameters of the loop.

What is claimed is:

1. A phase-frequency detector comprising:
   a detector receiving a phase error signal representing a phase error between two signals to detect a discontinuous jump of said phase error signal; and
   a signal corrector receiving said phase error signal to correct said phase error signal based on an output of said detector and outputs said corrected phase error signal as a frequency-phase error signal.

2. A phase-frequency detector according to claim 1, wherein said detector includes:
   a differentiator which calculates and outputs a differential of said phase error signal;
   a comparator which compares the output of said differentiator with an upper value and a lower value, and generates an UP signal or a DOWN signal, respectively, as a result of said comparison; and
   a state holding device which holds one of a plurality of states indicating a state of a frequency difference between said two signals and which when said UP signal or said DOWN signal occurs causes a state transition in response to the UP signal or the DOWN signal and outputs a current state as a signal representing a frequency error.

3. A phase-frequency detector according to claim 2, wherein said state holding device holds one of three states consisting of a first state in which a frequency of one of said two signals is higher than a frequency of the other of said two signals, a third state, in which a frequency relationship between said two signals is opposite to that in said first state, and a second state in which said frequency relationship is neither in said first state nor in said third state,
   when said state holding device is holding said first state and said DOWN signal occurs, said first state is retained, whereas when said state holding device is holding said first state and said UP signal occurs a transition is made from said first state to said second state,
   when said state holding device is holding said second state and said DOWN signal occurs, a transition is made to said first state whereas when said state holding device is holding said second state or said UP signal occurs a transition is made to said third state, and
   when said state holding device is holding said third state and said DOWN signal occurs, a transition is made to said second state whereas when said state holding device is holding said third state and said UP signal occurs said third state is retained.

4. A phase-frequency detector according to claim 3, wherein said signal corrector includes a latch circuit which, when said state holding device outputs said second state, lets said phase error signal pass therethrough for output as said frequency-phase error signal, and when said state holding device outputs said first state or said third state latches said phase error signal for output as said frequency-phase error signal.

5. A phase-frequency detector according to claim 3, wherein said signal corrector includes:
   a selector which selects a zero value when said state holding device outputs said second state and a negative value or a positive value when said state holding device outputs said first state or said third state, respectively; and
   an adder which adds the output of said selector to said phase error signal and outputs the result said frequency-phase error signal.

6. A phase-frequency detector according to claim 3, further comprising a lock detector which is operatively connected to said state holding device and which, when said state holding device continues to output said second state for a predetermined period, outputs a lock signal which indicates that one signal has locked onto the other signal.

7. A phase-locked loop circuit comprising:
   a phase comparator which compares a phase of an input signal with a phase of a signal output from an oscillator and outputs a phase error signal representing a phase error between the two signals;
   a phase-frequency detector including a detector which detects a discontinuous jump of said phase error signal and outputs a frequency error between said two signals based on a change in said phase error signal, and a signal corrector receiving said phase error signal to correct said phase error signal based on an output of said frequency error detector and outputs said corrected phase error signal as a frequency-phase error signal;
   a low-pass filter coupled to said phase-frequency detector to pass therethrough only a low-frequency component contained in said frequency-phase error signal; and
   said oscillator which outputs said signal output corresponding to an output of said low-pass filter.

8. A phase-locked loop circuit according to claim 7, wherein said detector includes:
   a differentiator which calculates and outputs a differential of said phase error signal;
   a comparator which compares the output of said differentiator with an upper value and a lower value, and generates an UP signal or a DOWN signal, respectively, as a result of said comparison; and
   a state holding device which holds one of a plurality of states indicating a state of a frequency difference between said two signals, and which, when said UP signal or said DOWN signal occurs, causes a state transition in response to the UP signal or the DOWN signal and outputs a current state as a signal representing a frequency error.

9. A phase-locked loop circuit according to claim 8, wherein said state holding device holds one of three states consisting of a first state in which a frequency of one of said two signals is higher than a frequency of the other of said two signals, a third state in which a frequency relationship between said two signals is opposite to that in said first state, and a second state in which said frequency relationship is neither in said first state nor in said third state, when said state holding device is holding said first state and said DOWN signal occurs, said first state is retained whereas when said state holding device is holding said first state and said UP signal occurs a transition is made from said first state to said second state, when said state holding device is holding said second state and said DOWN signal occurs, a transition is made to said first state, whereas when said state holding device is holding said second state and said UP signal occurs, a transition is made to said third state, and when said state holding device is holding said third state and said DOWN signal occurs, a transition is made to said second state, whereas when said state holding device is holding said third state and said UP signal occurs, said third state is retained.

10. A phase-locked loop circuit according to claim 9, wherein said signal corrector includes a latch circuit which, when said state holding device outputs said second state, lets said phase error signal, pass therethrough for output as said frequency-phase error signal, and when said state holding device outputs said first state or said third state, latches said phase error signal for output as said frequency-phase error signal.

11. A phase-locked loop circuit according to claim 9, wherein said signal corrector includes:

a selector which selects a zero value when said state holding device outputs said second state, and a negative value or a positive value when said state holding device outputs said first state or said third state, respectively; and an adder which adds the output of said selector to said phase error signal and outputs the result as said frequency-phase error signal.

12. A phase-locked loop circuit according to claim 9, further comprising a lock detector which is operatively connected to said state holding device and which, when said state holding device continues to output said second state for a predetermined period outputs a lock signal which indicates that the output signal of said oscillator has locked onto said input signal.

\* \* \* \* \*